United States Patent
Chen et al.

(10) Patent No.: US 10,546,622 B2
(45) Date of Patent: Jan. 28, 2020

(54) SPIN-ORBIT TORQUE MRAMS AND METHOD FOR FABRICATING THE SAME

(71) Applicant: Industrial Technology Research Institute, Hsinchu (TW)

(72) Inventors: Yu-Sheng Chen, Taoyuan (TW); I-Jung Wang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 16/055,000

(22) Filed: Aug. 3, 2018

(65) Prior Publication Data
US 2019/0164586 A1    May 30, 2019

(30) Foreign Application Priority Data

Nov. 28, 2017   (TW) .............................. 106141350 A

(51) Int. Cl.
| | | |
|---|---|---|
| H01L 29/82 | (2006.01) |
| G11C 11/16 | (2006.01) |
| H01L 43/04 | (2006.01) |
| H01L 43/14 | (2006.01) |
| H01L 43/08 | (2006.01) |

(Continued)

(52) U.S. Cl.
CPC ........ G11C 11/161 (2013.01); G11C 11/1675 (2013.01); G11C 11/18 (2013.01); H01L 43/04 (2013.01); H01L 43/06 (2013.01); H01L 43/08 (2013.01); H01L 43/10 (2013.01); H01L 43/12 (2013.01); H01L 43/14 (2013.01)

(58) Field of Classification Search
USPC ............ 257/421, 68–71, 296–309, 905–908, 257/E27.084–E27.097, E27.075, 295, 257/E21.646–E21.66
See application file for complete search history.

(56) References Cited

U.S. PATENT DOCUMENTS

| | | |
|---|---|---|
| 8,133,745 B2 | 3/2012 | Zhong et al. |
| 8,716,818 B2 | 5/2014 | Yoshikawa et al. |

(Continued)

FOREIGN PATENT DOCUMENTS

| | | |
|---|---|---|
| CN | 104393169 A | 3/2015 |
| CN | 106058041 A | 10/2016 |
| TW | 201709573 | 3/2017 |

OTHER PUBLICATIONS

H. Yoda et al., "Voltage-Control Spintronics Memory (VoCSM) Having Potentials of Ultra-Low Energy-Consumption and High-Density," 2016 IEEE International Electron Devices Meeting, Dec. 2016, pp. 27.6.1-27.6.4, IEEE, US.

Shunsuke Fukami et al., "A sub-ns three-terminal spin-orbit torque induced switching device," Symposium on VLSI Technology Digest of Technical Papers, Jun. 2016, 2 pages, IEEE, US.

(Continued)

*Primary Examiner* — Niki H Nguyen

(57) ABSTRACT

A spin-orbit torque MRAM is provided. The spin-orbit torque MRAM includes a spin Hall metal layer, a free magnetic layer disposed on the spin Hall metal layer, a barrier layer, and a pinned layer. The free magnetic layer includes a first area and a second area located on both sides thereof. The barrier layer includes a first area and a second area located on both sides thereof. The first area of the barrier layer is disposed on that of the free magnetic layer, and the second area of the barrier layer is disposed on that of the free magnetic layer. The pinned layer is disposed on the first area of the barrier layer.

22 Claims, 9 Drawing Sheets

(51) Int. Cl.
*H01L 43/10* (2006.01)
*H01L 43/06* (2006.01)
*H01L 43/12* (2006.01)
*G11C 11/18* (2006.01)

(56) References Cited

U.S. PATENT DOCUMENTS

| | | | |
|---|---|---|---|
| 8,896,041 B2 | 11/2014 | De Brosse et al. | |
| 8,963,222 B2 | 2/2015 | Guo | |
| 9,460,768 B2 | 10/2016 | Manipatruni et al. | |
| 9,461,243 B2 | 10/2016 | Guo | |
| 9,490,297 B1 | 11/2016 | Braganca et al. | |
| 9,601,688 B2 | 3/2017 | Ikeda | |
| 2014/0169088 A1* | 6/2014 | Buhrman | G11C 16/30 365/158 |
| 2016/0247550 A1* | 8/2016 | Fukami | H01L 43/08 |

OTHER PUBLICATIONS

Cheng-Wei Chien et al., "Evidences of Reactive-Ion-Etching Induced Damages to the Ferromagnet of Perpendicular Magnetic Tunnel Junctions," IEEE Electron Device Letters, Feb. 2013, pp. 241-243, vol. 34, No. 2, IEEE, US.

Yusung Kim et al., "DSH-MRAM: Differential Spin Hall MRAM for On-Chip Memories," IEEE EElectron Device Letters, Oct. 2013, pp. 1259-1261, vol. 34, No. 10, IEEE, US.

Lugiao Liu et al., "Spin-Torque Switching with the Giant Spin Hall Effect of Tantalum," Science, May 2012, pp. 555-558, vol. 336, American Association for the Advancement of Science, US.

Rajendra Bishnoi et al., "Architecture Aspects in Design and Analysis of SOT-based Memories," 2014 19$^{th}$ Asia and South Pacific Design Automation Conference, Jan. 2014, pp. 700-707, IEEE, US.

Taiwan Patetn Office, Office Action, Patent Application Serial No. 106141350, dated Mar. 7, 2019, Taiwan.

* cited by examiner

SPIN-ORBIT TORQUE MRAMS AND METHOD FOR FABRICATING THE SAME

CROSS REFERENCE TO RELATED APPLICATIONS

This Application claims priority of Taiwan Patent Application No. 106141350, filed on Nov. 28, 2017, the entirety of which is incorporated by reference herein.

TECHNICAL FIELD

The disclosure relates to a spin-orbit torque MRAM, and relates to a spin-orbit torque MRAM with a uniform ultra-thin metal layer and a method for fabricating the same.

BACKGROUND

A spin-orbit torque (SOT) MRAM is a magnetic memory technology which is able to improve an operating speed to 1 ns and achieve an unlimited number of operations, and is considered as an important technology to undertake the spin torque transfer (STT) MRAM. The highest efficiency of the spin Hall effect can be achieved in a 3-nm ultra-thin heavy metal layer. Therefore, how to fabricate a 3-nm metal layer structure with high uniformity is the key to mass production.

SUMMARY

For a magnetic tunnel junction (MTJ) device with a top pinned layer, an etching process stops at an ultra-thin spin Hall metal layer. The bottom ultra-thin heavy metal layer of the average spin-orbit torque (SOT) MRAM can become damaged during the etching process, and this may result in uneven operation characteristics and component failure. In order to overcome this problem, the disclosure provides a spin-orbit torque (SOT) MRAM with a uniform ultra-thin heavy metal layer and a method for fabricating the SOT MRAM.

In accordance with one embodiment of the disclosure, a spin-orbit torque (SOT) MRAM is provided. The spin-orbit torque MRAM comprises a spin Hall metal layer, a free magnetic layer, a barrier layer, and a pinned layer. The free magnetic layer is disposed on the spin Hall metal layer. The barrier layer is disposed on the free magnetic layer. The barrier layer comprises a first area and a second area located on both sides of the first area, and the thickness of the second area is equal to or smaller than that of the first area. The pinned layer is disposed on the first area of the barrier layer.

In accordance with one embodiment of the disclosure, a spin-orbit torque (SOT) MRAM is provided. The spin-orbit torque MRAM comprises a spin Hall metal layer, a free magnetic layer, a barrier layer, and a pinned layer. The free magnetic layer is disposed on the spin Hall metal layer. The free magnetic layer comprises a first area and a second area located on both sides of the first area, and the thickness of the second area is equal to or smaller than that of the first area. The barrier layer is disposed on the first area of the free magnetic layer. The pinned layer is disposed on the barrier layer.

In accordance with one embodiment of the disclosure, a high-efficiency method for fabricating a spin-orbit torque (SOT) MRAM is provided, comprising the following steps. A spin Hall metal layer is provided. A free magnetic layer is disposed on the spin Hall metal layer. The free magnetic layer comprises a first area and a second area located on both sides of the first area. A barrier layer is disposed on the free magnetic layer. The barrier layer comprises a first area and a second area located on both sides of the first area. The first area of the barrier layer is disposed on the first area of the free magnetic layer. The second area of the barrier layer is disposed on the second area of the free magnetic layer. A pinned layer is disposed on the barrier layer. A patterned photoresist layer is disposed on the pinned layer. The pinned layer is etched using the patterned photoresist layer as a mask to expose the second area of the barrier layer.

The present disclosure provides a top-pinned layer MTJ structure which is able to terminate etching processes at either any thickness position of a barrier layer or any thickness position of a bottom free magnetic layer, used as a component to develop the optimized process technology of the spin-orbit torque (SOT) MRAM. The uniformity of various layers can be achieved using etch selectivity ratios between various materials, for example, the etch selectivity ratio between the top pinned layer and the barrier oxide layer or between the barrier oxide layer and the free magnetic layer. In addition, a bottom ultra-thin heavy metal layer can be protected by the residual material of the barrier layer or the free magnetic layer. This component structure not only generates the splitting of the upper and lower spin currents by spin Hall effect, but it also achieves the magnetic moment reversal of the free magnetic layer by the spin-orbit effect. Simultaneously, this component structure can overcome problems with the bottom ultra-thin metal layer of a top-pinned layer MTJ of a conventional spin-orbit torque (SOT) structure getting damaged in the etching process and causing uneven operation characteristics and component failure. This process-optimized component structure can significantly improve the production yield of the spin-orbit torque (SOT) MRAM.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
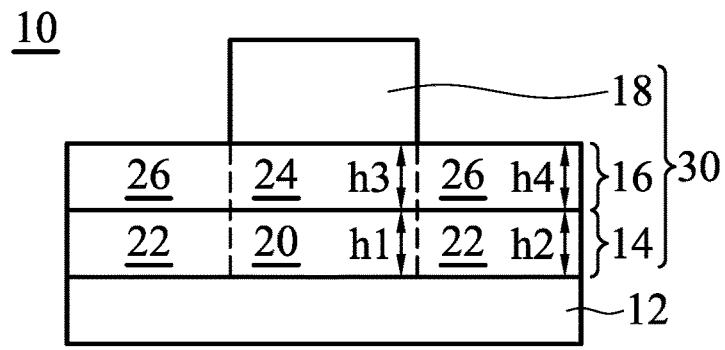
FIG. 1 is a cross-sectional view of a spin-orbit torque (SOT) MRAM in accordance with one embodiment of the disclosure.

Referring to FIG. 1, in accordance with one embodiment of the disclosure, a spin-orbit torque magnetoresistive random access memory (SOT MRAM) 10 is provided. FIG. 1 is a cross-sectional view of the SOT MRAM 10.

In this embodiment, the SOT MRAM 10 comprises a spin Hall metal layer 12, a free magnetic layer 14, a barrier layer 16, and a pinned layer 18.

The free magnetic layer 14 is disposed on the spin Hall metal layer 12. The free magnetic layer 14 comprises a first area 20 and a second area 22. The second area 22 is located on both sides of the first area 20. The thickness h2 of the second area 22 is equal to the thickness h1 of the first area 20.

The barrier layer 16 comprises a first area 24 and a second area 26. The second area 26 is located on both sides of the first area 24. The first area 24 of the barrier layer 16 is disposed on the first area 20 of the free magnetic layer 14. The second area 26 of the barrier layer 16 is disposed on the second area 22 of the free magnetic layer 14.

The pinned layer 18 is disposed on the first area 24 of the barrier layer 16.

The thickness h4 of the second area 26 is equal to the thickness h3 of the first area 24 of the barrier layer 16.

In some embodiments, the spin Hall metal layer 12 comprises heavy metal materials capable of producing large spin Hall effect, for example, tantalum (Ta), platinum (Pt), hafnium (Hf), tungsten (W), zirconium (Zr), or an alloy thereof.

In some embodiments, the thickness of the spin Hall metal layer 12 is smaller than about 10 nm.

In some embodiments, the free magnetic layer 14 may comprise a single layer or a composite layer.

In some embodiments, the free magnetic layer 14 may comprise a single layer of, for example, iron (Fe), cobalt (Co), nickel (Ni), gadolinium (Gd), terbium (Tb), cobalt iron boron (CoFeB) alloy, or cobalt iron (CoFe) alloy.

In some embodiments, the free magnetic layer 14 may comprise a composite layer of, for example, cobalt iron boron (CoFeB) alloy/tantalum (Ta)/cobalt iron boron (CoFeB) alloy or cobalt iron (CoFe) alloy/tantalum (Ta)/cobalt iron (CoFe).

In some embodiments, the thickness h1 of the first area 20 of the free magnetic layer 14 is in a range from about 1 nm to about 3 nm.

In some embodiments, the barrier layer 16 may comprise magnesium oxide (MgO) or aluminum oxide (AlOx).

In some embodiments, the thickness h3 of the first area 24 of the barrier layer 16 is in a range from about 0.5 nm to about 2 nm.

In some embodiments, the pinned layer 18 may comprise a single layer or a composite layer.

In some embodiments, the pinned layer 18 may comprise a single layer of, for example, cobalt iron (CoFe) alloy, cobalt iron boron (CoFeB) alloy, or cobalt nickel (CoNi) alloy.

In some embodiments, the pinned layer 18 may comprise a composite layer of, for example, cobalt (Co)/platinum (Pt), cobalt (Co)/nickel (Ni), or cobalt (Co)/palladium (Pd).

In the SOT MRAM 10, the free magnetic layer 14, the barrier layer 16 and the pinned layer 18 form a magnetic tunnel junction (MTJ) device 30.

In this embodiment, the shape of the patterned pinned layer 18 may be a circle, an ellipse, a square, or a rectangle, from a top view.

In some embodiments, the magnetic tunnel junction (MTJ) device 30 may be disposed at any position on the spin Hall metal layer 12 without limitation.

Figure 2A:
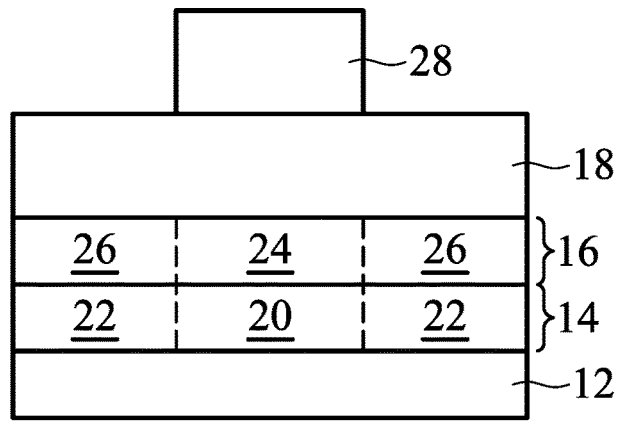
FIGS. 2A-2B are cross-sectional views of a method for fabricating a spin-orbit torque (SOT) MRAM in accordance with one embodiment of the disclosure.
Figure 2B:
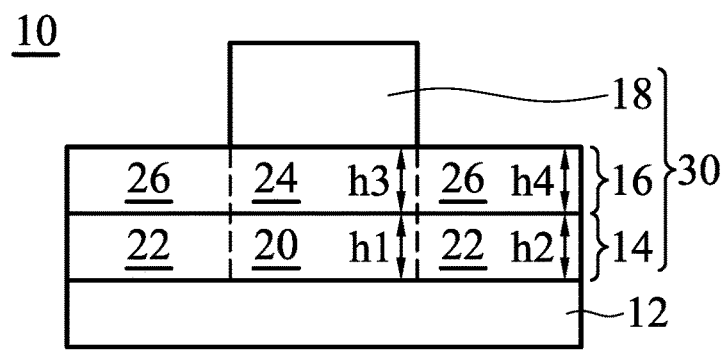

Referring to FIGS. 2A-2B, in accordance with one embodiment of the disclosure, a method for fabricating a spin-orbit torque magnetoresistive random access memory (SOT MRAM) 10 is provided. FIGS. 2A-2B are cross-sectional views of the fabrication method of the SOT MRAM 10.

As shown in FIG. 2A, a spin Hall metal layer 12 is provided.

Next, a free magnetic layer 14 is disposed on the spin Hall metal layer 12. The free magnetic layer 14 comprises a first area 20 and a second area 22. The second area 22 is located on both sides of the first area 20.

Next, a barrier layer 16 is disposed on the free magnetic layer 14. The barrier layer 16 comprises a first area 24 and a second area 26. The second area 26 is located on both sides of the first area 24. The first area 24 of the barrier layer 16 is disposed on the first area 20 of the free magnetic layer 14. The second area 26 of the barrier layer 16 is disposed on the second area 22 of the free magnetic layer 14.

Next, a pinned layer 18 is disposed on the barrier layer 16.

Next, a patterned photoresist layer 28 is disposed on the pinned layer 18.

Next, the pinned layer 18 is etched using the patterned photoresist layer 28 as a mask to expose the second area 26 of the barrier layer 16. The patterned photoresist layer 28 is then removed, as shown in FIG. 2B.

In some embodiments, the pinned layer 18 is etched by, for example, a plasma etching (PE) process, a reactive ion etching (RIE) process, an ion beam etching (IBE) process, or an inductively coupled plasma etching (ICPE) process.

In some embodiments, the pinned layer 18 is etched by, for example, a reactive ion etching (RIE) process.

In some embodiments, the etching gas used in the reactive ion etching (RIE) process may comprise carbon monoxide (CO), ammonia ($NH_3$), oxygen, hydrogen, or fluorine ($F_2$) and argon (Ar).

In this embodiment, the stop time of the etching process is controlled and determined by the difference in the etching rate between various materials, and by simultaneously employing an end point detector (EPD) so that the second area 26 of the barrier layer 16 can maintain the desired thickness; that is, the thickness h4 of the second area 26 corresponds to the thickness h3 of the first area 24 of the barrier layer 16.

Thus, the SOT MRAM 10 is completed.

Figure 3:
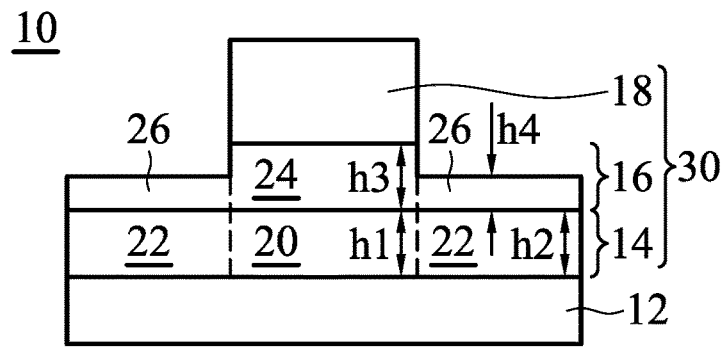
FIG. 3 is a cross-sectional view of a spin-orbit torque (SOT) MRAM in accordance with one embodiment of the disclosure.

Referring to FIG. 3, in accordance with one embodiment of the disclosure, a spin-orbit torque magnetoresistive random access memory (SOT MRAM) 10 is provided. FIG. 3 is a cross-sectional view of the SOT MRAM 10.

In this embodiment, the SOT MRAM 10 comprises a spin Hall metal layer 12, a free magnetic layer 14, a barrier layer 16, and a pinned layer 18.

The free magnetic layer 14 is disposed on the spin Hall metal layer 12. The free magnetic layer 14 comprises a first area 20 and a second area 22. The second area 22 is located on both sides of the first area 20. The thickness h2 of the second area 22 is equal to the thickness h1 of the first area 20.

The barrier layer 16 comprises a first area 24 and a second area 26. The second area 26 is located on both sides of the first area 24. The first area 24 of the barrier layer 16 is disposed on the first area 20 of the free magnetic layer 14. The second area 26 of the barrier layer 16 is disposed on the second area 22 of the free magnetic layer 14.

The pinned layer 18 is disposed on the first area 24 of the barrier layer 16.

The thickness h4 of the second area 26 is smaller than the thickness h3 of the first area 24 of the barrier layer 16. For example, the thickness h4 of the second area 26 is about half the thickness h3 of the first area 24 of the barrier layer 16.

In some embodiments, when the thickness h4 of the second area 26 is smaller than the thickness h3 of the first area 24 of the barrier layer 16, the thickness h4 of the second area 26 may be any proportionality to the thickness h3 of the first area 24 of the barrier layer 16.

In some embodiments, the spin Hall metal layer 12 comprises heavy metal materials capable of producing large spin Hall effect, for example, tantalum (Ta), platinum (Pt), hafnium (Hf), tungsten (W), zirconium (Zr), or an alloy thereof.

In some embodiments, the thickness of the spin Hall metal layer 12 is smaller than about 10 nm.

In some embodiments, the free magnetic layer 14 may comprise a single layer or a composite layer.

In some embodiments, the free magnetic layer 14 may comprise a single layer of, for example, iron (Fe), cobalt (Co), nickel (Ni), gadolinium (Gd), terbium (Tb), cobalt iron boron (CoFeB) alloy, or cobalt iron (CoFe) alloy.

In some embodiments, the free magnetic layer 14 may comprise a composite layer of, for example, cobalt iron boron (CoFeB) alloy/tantalum (Ta)/cobalt iron boron (CoFeB) alloy or cobalt iron (CoFe) alloy/tantalum (Ta)/cobalt iron (CoFe).

In some embodiments, the thickness h1 of the first area 20 of the free magnetic layer 14 is in a range from about 1 nm to about 3 nm.

In some embodiments, the barrier layer 16 may comprise magnesium oxide (MgO) or aluminum oxide (AlOx).

In some embodiments, the thickness h3 of the first area 24 of the barrier layer 16 is in a range from about 0.5 nm to about 2 nm.

In some embodiments, the pinned layer 18 may comprise a single layer or a composite layer.

In some embodiments, the pinned layer 18 may comprise a single layer of, for example, cobalt iron (CoFe) alloy, cobalt iron boron (CoFeB) alloy, or cobalt nickel (CoNi) alloy.

In some embodiments, the pinned layer 18 may comprise a composite layer of, for example, cobalt (Co)/platinum (Pt), cobalt (Co)/nickel (Ni), or cobalt (Co)/palladium (Pd).

In the SOT MRAM 10, the free magnetic layer 14, the barrier layer 16 and the pinned layer 18 form a magnetic tunnel junction (MTJ) device 30.

In this embodiment, the shape of the patterned pinned layer 18 and the first area 24 of the barrier layer 16 may comprise a circle, an ellipse, a square, or a rectangle, from a top view.

In some embodiments, the magnetic tunnel junction (MTJ) device 30 may be disposed at any position on the spin Hall metal layer 12 without limitation.

Figure 4A:
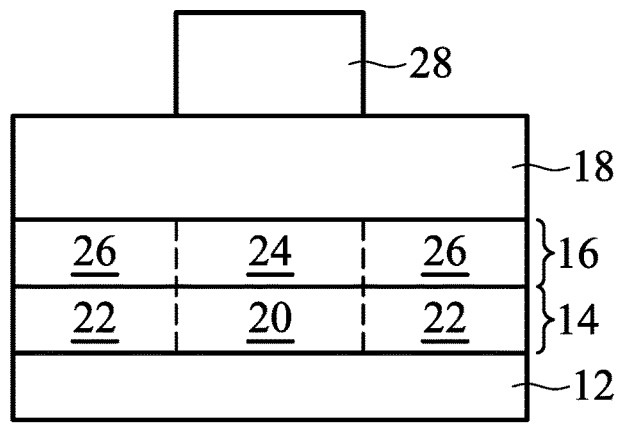
FIGS. 4A-4B are cross-sectional views of a method for fabricating a spin-orbit torque (SOT) MRAM in accordance with one embodiment of the disclosure.
Figure 4B:
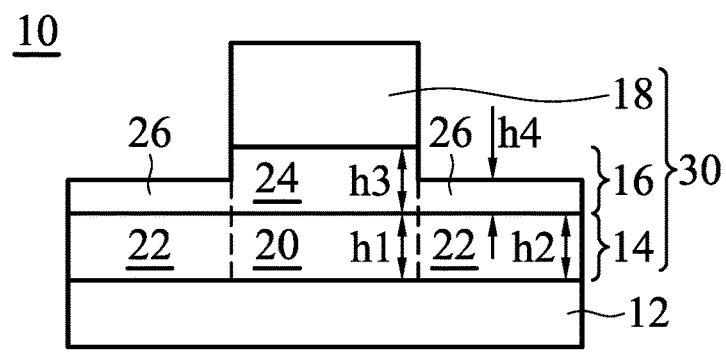

Referring to FIGS. 4A-4B, in accordance with one embodiment of the disclosure, a method for fabricating a spin-orbit torque magnetoresistive random access memory (SOT MRAM) 10 is provided. FIGS. 4A-4B are cross-sectional views of the fabrication method of the SOT MRAM 10.

As shown in FIG. 4A, a spin Hall metal layer 12 is provided.

Next, a free magnetic layer 14 is disposed on the spin Hall metal layer 12. The free magnetic layer 14 comprises a first area 20 and a second area 22. The second area 22 is located on both sides of the first area 20.

Next, a barrier layer 16 is disposed on the free magnetic layer 14. The barrier layer 16 comprises a first area 24 and a second area 26. The second area 26 is located on both sides of the first area 24. The first area 24 of the barrier layer 16 is disposed on the first area 20 of the free magnetic layer 14. The second area 26 of the barrier layer 16 is disposed on the second area 22 of the free magnetic layer 14.

Next, a pinned layer 18 is disposed on the barrier layer 16.

Next, a patterned photoresist layer 28 is disposed on the pinned layer 18.

Next, the pinned layer 18 is etched using the patterned photoresist layer 28 as a mask to expose the second area 26 of the barrier layer 16.

Next, the second area 26 of the barrier layer 16 is continuously etched such that the thickness h4 of the second area 26 is smaller than the thickness h3 of the first area 24 of the barrier layer 16.

The patterned photoresist layer 28 is then removed, as shown in FIG. 4B.

In some embodiments, the pinned layer 18 and the barrier layer 16 are etched by, for example, a plasma etching (PE) process, a reactive ion etching (RIE) process, an ion beam etching (IBE) process, or an inductively coupled plasma etching (ICPE) process.

In some embodiments, the pinned layer 18 and the barrier layer 16 are etched by, for example, a reactive ion etching (RIE) process.

In some embodiments, the etching gas used in the reactive ion etching (RIE) process may comprise carbon monoxide (CO), ammonia ($NH_3$), oxygen, hydrogen, or fluorine ($F_2$) and argon (Ar).

In some embodiments, the etch selectivity ratio between the pinned layer 18 and the barrier layer 16 is about 3:1 or above.

In this embodiment, the stop time of the etching process is controlled and determined by the difference in the etching rate between various materials and by simultaneously employing an end point detector (EPD) so that the second area 26 of the barrier layer 16 can maintain the desired thickness; that is, the thickness h4 of the second area 26 is smaller than the thickness h3 of the first area 24 of the barrier layer 16.

Thus, the SOT MRAM 10 is completed.

Figure 5:
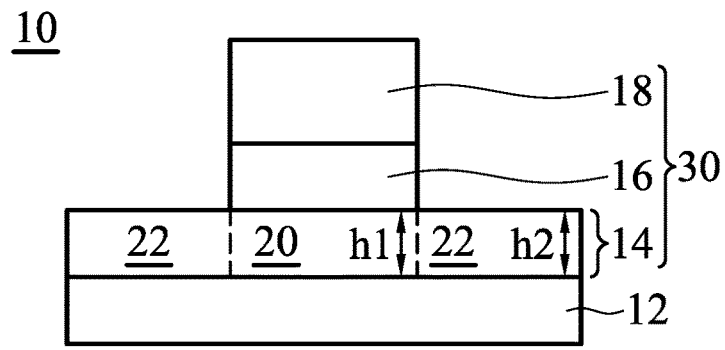
FIG. 5 is a cross-sectional view of a spin-orbit torque (SOT) MRAM in accordance with one embodiment of the disclosure.

Referring to FIG. 5, in accordance with one embodiment of the disclosure, a spin-orbit torque magnetoresistive random access memory (SOT MRAM) 10 is provided. FIG. 5 is a cross-sectional view of the SOT MRAM 10.

In this embodiment, the SOT MRAM 10 comprises a spin Hall metal layer 12, a free magnetic layer 14, a barrier layer 16, and a pinned layer 18.

The free magnetic layer 14 is disposed on the spin Hall metal layer 12. The free magnetic layer 14 comprises a first area 20 and a second area 22. The second area 22 is located on both sides of the first area 20. The thickness h2 of the second area 22 is equal to the thickness h1 of the first area 20.

The barrier layer 16 is disposed on the first area 20 of the free magnetic layer 14.

The pinned layer 18 is disposed on the barrier layer 16.

The barrier layer 16 does not cover the second area 22 of the free magnetic layer 14. That is, the thickness of the second area 26 of the barrier layer 16 is substantially zero in this embodiment.

In some embodiments, the spin Hall metal layer 12 comprises heavy metal materials capable of producing large spin Hall effect, for example, tantalum (Ta), platinum (Pt), hafnium (Hf), tungsten (W), zirconium (Zr), or an alloy thereof.

In some embodiments, the thickness of the spin Hall metal layer 12 is smaller than about 10 nm.

In some embodiments, the free magnetic layer 14 may comprise a single layer or a composite layer.

In some embodiments, the free magnetic layer 14 may comprise a single layer of, for example, iron (Fe), cobalt (Co), nickel (Ni), gadolinium (Gd), terbium (Tb), cobalt iron boron (CoFeB) alloy, or cobalt iron (CoFe) alloy.

In some embodiments, the free magnetic layer 14 may comprise a composite layer of, for example, cobalt iron boron (CoFeB) alloy/tantalum (Ta)/cobalt iron boron (CoFeB) alloy or cobalt iron (CoFe) alloy/tantalum (Ta)/cobalt iron (CoFe).

In some embodiments, the thickness h1 of the first area 20 of the free magnetic layer 14 is in a range from about 1 nm to about 3 nm.

In some embodiments, the barrier layer 16 may comprise magnesium oxide (MgO) or aluminum oxide (AlOx).

In some embodiments, the thickness of the barrier layer 16 is in a range from about 0.5 nm to about 2 nm.

In some embodiments, the pinned layer 18 may comprise a single layer or a composite layer.

In some embodiments, the pinned layer 18 may comprise a single layer of, for example, cobalt iron (CoFe) alloy, cobalt iron boron (CoFeB) alloy, or cobalt nickel (CoNi) alloy.

In some embodiments, the pinned layer 18 may comprise a composite layer of, for example, cobalt (Co)/platinum (Pt), cobalt (Co)/nickel (Ni), or cobalt (Co)/palladium (Pd).

In the SOT MRAM 10, the free magnetic layer 14, the barrier layer 16 and the pinned layer 18 form a magnetic tunnel junction (MTJ) device 30.

In this embodiment, the shape of the patterned pinned layer 18 and the barrier layer 16 may comprise a circle, an ellipse, a square, or a rectangle, from a top view.

In some embodiments, the magnetic tunnel junction (MTJ) device 30 may be disposed at any position on the spin Hall metal layer 12 without limitation.

Figure 6A:
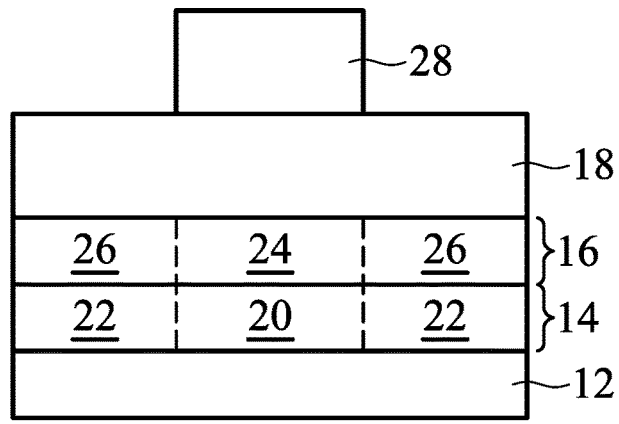
FIGS. 6A-6B are cross-sectional views of a method for fabricating a spin-orbit torque (SOT) MRAM in accordance with one embodiment of the disclosure.
Figure 6B:
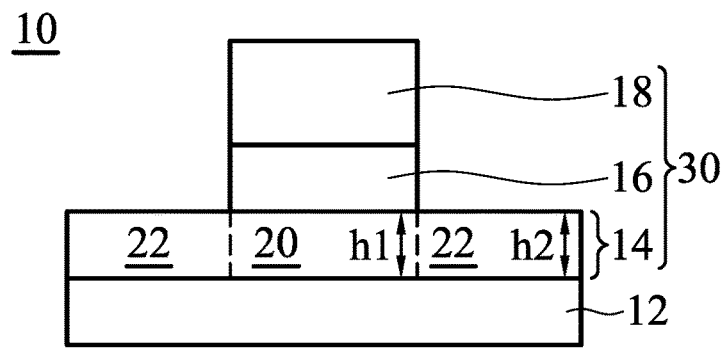

Referring to FIGS. 6A-6B, in accordance with one embodiment of the disclosure, a method for fabricating a spin-orbit torque magnetoresistive random access memory (SOT MRAM) 10 is provided. FIGS. 6A-6B are cross-sectional views of the fabrication method of the SOT MRAM 10.

As shown in FIG. 6A, a spin Hall metal layer 12 is provided.

Next, a free magnetic layer 14 is disposed on the spin Hall metal layer 12. The free magnetic layer 14 comprises a first area 20 and a second area 22. The second area 22 is located on both sides of the first area 20.

Next, a barrier layer 16 is disposed on the free magnetic layer 14. The barrier layer 16 comprises a first area 24 and a second area 26. The second area 26 is located on both sides of the first area 24. The first area 24 of the barrier layer 16 is disposed on the first area 20 of the free magnetic layer 14. The second area 26 of the barrier layer 16 is disposed on the second area 22 of the free magnetic layer 14.

Next, a pinned layer 18 is disposed on the barrier layer 16.

Next, a patterned photoresist layer 28 is disposed on the pinned layer 18.

Next, the pinned layer 18 is etched using the patterned photoresist layer 28 as a mask to expose the second area 26 of the barrier layer 16.

Next, the second area 26 of the barrier layer 16 is continuously etched until the second area 22 of the free magnetic layer 14 is exposed.

The patterned photoresist layer 28 is then removed, as shown in FIG. 6B.

In some embodiments, the pinned layer 18 and the barrier layer 16 are etched by, for example, a plasma etching (PE) process, a reactive ion etching (RIE) process, an ion beam etching (IBE) process, or an inductively coupled plasma etching (ICPE) process.

In some embodiments, the pinned layer 18 and the barrier layer 16 are etched by, for example, a reactive ion etching (RIE) process.

In some embodiments, the etching gas used in the reactive ion etching (RIE) process may comprise carbon monoxide (CO), ammonia (NH$_3$), oxygen, hydrogen, or fluorine (F$_2$) and argon (Ar).

In some embodiments, the etch selectivity ratio between the pinned layer 18 and the barrier layer 16 is about 3:1 or above.

In this embodiment, the stop time of the etching process is controlled and determined by the difference in the etching rate between various materials and by simultaneously employing an end point detector (EPD) so that the second area 22 of the free magnetic layer 14 can maintain the desired thickness; that is, the thickness h2 of the second area 22 corresponds to the thickness h1 of the first area 20 of the free magnetic layer 14.

Thus, the SOT MRAM 10 is completed.

Figure 7:
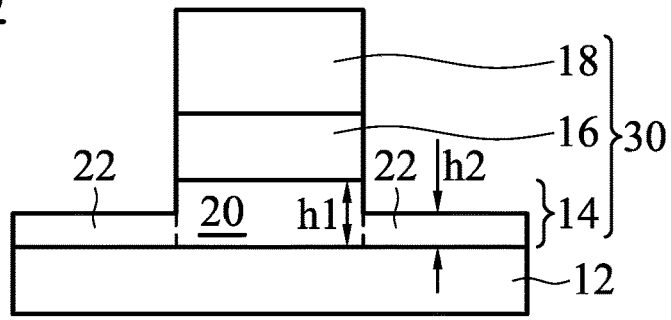
FIG. 7 is a cross-sectional view of a spin-orbit torque (SOT) MRAM in accordance with one embodiment of the disclosure.

Referring to FIG. 7, in accordance with one embodiment of the disclosure, a spin-orbit torque magnetoresistive random access memory (SOT MRAM) 10 is provided. FIG. 7 is a cross-sectional view of the SOT MRAM 10.

In this embodiment, the SOT MRAM 10 comprises a spin Hall metal layer 12, a free magnetic layer 14, a barrier layer 16, and a pinned layer 18.

The free magnetic layer 14 is disposed on the spin Hall metal layer 12. The free magnetic layer 14 comprises a first area 20 and a second area 22. The second area 22 is located on both sides of the first area 20.

The barrier layer 16 is disposed on the first area 20 of the free magnetic layer 14.

The pinned layer 18 is disposed on the barrier layer 16.

The thickness h2 of the second area 22 is smaller than the thickness h1 of the first area 20 of the free magnetic layer 14. For example, the thickness h2 of the second area 22 is about half the thickness h1 of the first area 20 of the free magnetic layer 14.

In some embodiments, when the thickness h2 of the second area 22 is smaller than the thickness h1 of the first area 20 of the free magnetic layer 14, the thickness h2 of the second area 22 may be any proportionality to the thickness h1 of the first area 20 of the free magnetic layer 14.

In some embodiments, the spin Hall metal layer 12 comprises heavy metal materials capable of producing large spin Hall effect, for example, tantalum (Ta), platinum (Pt), hafnium (Hf), tungsten (W), zirconium (Zr), or an alloy thereof.

In some embodiments, the thickness of the spin Hall metal layer 12 is smaller than about 10 nm.

In some embodiments, the free magnetic layer 14 may comprise a single layer or a composite layer.

In some embodiments, the free magnetic layer 14 may comprise a single layer of, for example, iron (Fe), cobalt (Co), nickel (Ni), gadolinium (Gd), terbium (Tb), cobalt iron boron (CoFeB) alloy, or cobalt iron (CoFe) alloy.

In some embodiments, the free magnetic layer 14 may comprise a composite layer of, for example, cobalt iron boron (CoFeB) alloy/tantalum (Ta)/cobalt iron boron (CoFeB) alloy or cobalt iron (CoFe) alloy/tantalum (Ta)/cobalt iron (CoFe).

In some embodiments, the thickness h1 of the first area 20 of the free magnetic layer 14 is in a range from about 1 nm to about 3 nm.

In some embodiments, the barrier layer 16 may comprise magnesium oxide (MgO) or aluminum oxide (AlOx).

In some embodiments, the thickness of the barrier layer 16 is in a range from about 0.5 nm to about 2 nm.

In some embodiments, the pinned layer 18 may comprise a single layer or a composite layer.

In some embodiments, the pinned layer 18 may comprise a single layer of, for example, cobalt iron (CoFe) alloy, cobalt iron boron (CoFeB) alloy, or cobalt nickel (CoNi) alloy.

In some embodiments, the pinned layer 18 may comprise a composite layer of, for example, cobalt (Co)/platinum (Pt), cobalt (Co)/nickel (Ni), or cobalt (Co)/palladium (Pd).

In the SOT MRAM 10, the free magnetic layer 14, the barrier layer 16 and the pinned layer 18 form a magnetic tunnel junction (MTJ) device 30.

In this embodiment, the shape of the patterned pinned layer 18, the barrier layer 16 and the first area 20 of the free magnetic layer 14 may comprise a circle, an ellipse, a square, or a rectangle, from a top view.

In some embodiments, the magnetic tunnel junction (MTJ) device 30 may be disposed at any position on the spin Hall metal layer 12 without limitation.

Figure 8A:
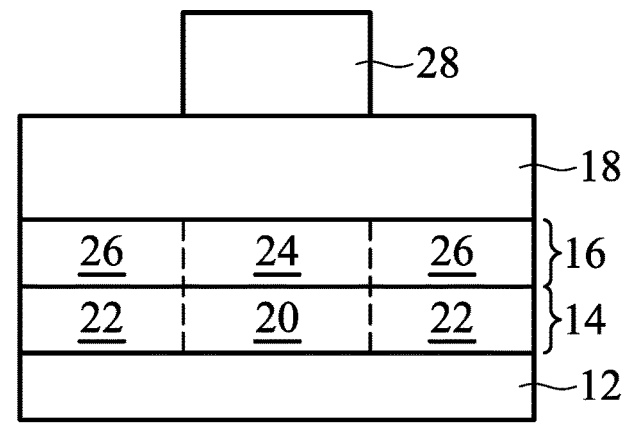
FIGS. 8A-8B are cross-sectional views of a method for fabricating a spin-orbit torque (SOT) MRAM in accordance with one embodiment of the disclosure.
Figure 8B:
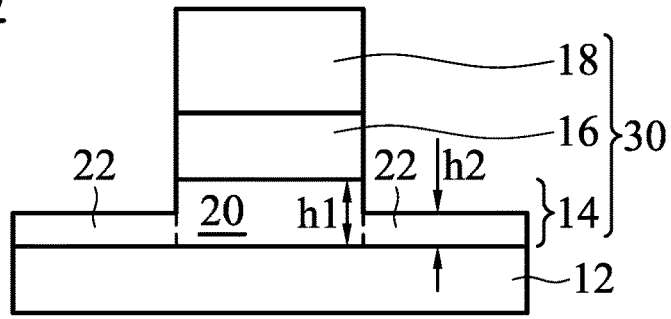

Referring to FIGS. 8A-8B, in accordance with one embodiment of the disclosure, a method for fabricating a spin-orbit torque magnetoresistive random access memory (SOT MRAM) 10 is provided. FIGS. 8A-8B are cross-sectional views of the fabrication method of the SOT MRAM 10.

As shown in FIG. 8A, a spin Hall metal layer 12 is provided.

Next, a free magnetic layer 14 is disposed on the spin Hall metal layer 12. The free magnetic layer 14 comprises a first area 20 and a second area 22. The second area 22 is located on both sides of the first area 20.

Next, a barrier layer 16 is disposed on the free magnetic layer 14. The barrier layer 16 comprises a first area 24 and a second area 26. The second area 26 is located on both sides of the first area 24. The first area 24 of the barrier layer 16 is disposed on the first area 20 of the free magnetic layer 14. The second area 26 of the barrier layer 16 is disposed on the second area 22 of the free magnetic layer 14.

Next, a pinned layer 18 is disposed on the barrier layer 16.

Next, a patterned photoresist layer 28 is disposed on the pinned layer 18.

Next, the pinned layer 18 is etched using the patterned photoresist layer 28 as a mask to expose the second area 26 of the barrier layer 16.

Next, the second area 26 of the barrier layer 16 is continuously etched until the second area 22 of the free magnetic layer 14 is exposed. The second area 22 of the free magnetic layer 14 is then continuously etched such that the thickness h2 of the second area 22 is smaller than the thickness h1 of the first area 20 of the free magnetic layer 14.

The patterned photoresist layer 28 is then removed, as shown in FIG. 8B.

In some embodiments, the pinned layer 18, the barrier layer 16 and the free magnetic layer 14 are etched by, for example, a plasma etching (PE) process, a reactive ion etching (RIE) process, an ion beam etching (IBE) process, or an inductively coupled plasma etching (ICPE) process.

In some embodiments, the pinned layer 18, the barrier layer 16 and the free magnetic layer 14 are etched by, for example, a reactive ion etching (RIE) process.

In some embodiments, the etching gas used in the reactive ion etching (RIE) process may comprise carbon monoxide (CO), ammonia ($NH_3$), oxygen, hydrogen, or fluorine ($F_2$) and argon (Ar).

In some embodiments, the etch selectivity ratio between the pinned layer 18 and the barrier layer 16 is about 3:1 or above.

In some embodiments, the etch selectivity ratio between the barrier layer 16 and the free magnetic layer 14 is about 1:3 or above.

In this embodiment, the stop time of the etching process is controlled and determined by the difference in the etching rate between various materials and by simultaneously employing an end point detector (EPD) so that the second area 22 of the free magnetic layer 14 can maintain the desired thickness; that is, the thickness h2 of the second area 22 is smaller than the thickness h1 of the first area 20 of the free magnetic layer 14.

Thus, the SOT MRAM 10 is completed.

In some embodiments, the spin Hall metal layer 12 comprises heavy metal materials capable of producing large spin Hall effect, for example, tantalum (Ta), platinum (Pt), hafnium (Hf), tungsten (W), zirconium (Zr), or an alloy thereof.

In some embodiments, the thickness of the spin Hall metal layer 12 is smaller than about 10 nm.

In some embodiments, the free magnetic layer 14 may comprise a single layer or a composite layer.

In some embodiments, the free magnetic layer 14 may comprise a single layer of, for example, iron (Fe), cobalt (Co), nickel (Ni), gadolinium (Gd), terbium (Tb), cobalt iron boron (CoFeB) alloy, or cobalt iron (CoFe) alloy.

In some embodiments, the free magnetic layer 14 may comprise a composite layer of, for example, cobalt iron boron (CoFeB) alloy/tantalum (Ta)/cobalt iron boron (CoFeB) alloy or cobalt iron (CoFe) alloy/tantalum (Ta)/cobalt iron (CoFe).

In some embodiments, the thickness of the free magnetic layer 14 is in a range from about 1 nm to about 3 nm.

In some embodiments, the barrier layer 16 may comprise magnesium oxide (MgO) or aluminum oxide (AlOx).

In some embodiments, the thickness of the barrier layer 16 is in a range from about 0.5 nm to about 2 nm.

In some embodiments, the pinned layer 18 may comprise a single layer or a composite layer.

In some embodiments, the pinned layer 18 may comprise a single layer of, for example, cobalt iron (CoFe) alloy, cobalt iron boron (CoFeB) alloy, or cobalt nickel (CoNi) alloy.

In some embodiments, the pinned layer 18 may comprise a composite layer of, for example, cobalt (Co)/platinum (Pt), cobalt (Co)/nickel (Ni), or cobalt (Co)/palladium (Pd).

In the SOT MRAM 10, the free magnetic layer 14, the barrier layer 16 and the pinned layer 18 form a magnetic tunnel junction (MTJ) device 30.

In this embodiment, the shape of the patterned pinned layer 18, the barrier layer 16 and the free magnetic layer 14 may comprise a circle, an ellipse, a square, or a rectangle, from a top view.

In some embodiments, the magnetic tunnel junction (MTJ) device 30 may be disposed at any position on the spin Hall metal layer 12 without limitation.

Figure 9:
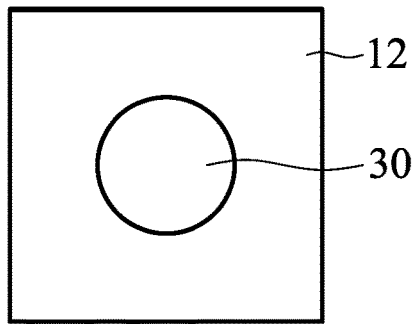
FIG. 9 is a top view of a spin-orbit torque (SOT) MRAM in accordance with one embodiment of the disclosure.

Referring to FIG. 9, in accordance with one embodiment of the disclosure, a spin-orbit torque magnetoresistive random access memory (SOT MRAM) 10 is provided. FIG. 9 is a top view of the SOT MRAM 10.

In this embodiment, the SOT MRAM 10 comprises a spin Hall metal layer 12 and a magnetic tunnel junction (MTJ) device 30.

The magnetic tunnel junction (MTJ) device 30 is disposed on the spin Hall metal layer 12.

In this embodiment, the magnetic tunnel junction (MTJ) device 30 comprises a free magnetic layer, a barrier layer and a pinned layer (not shown).

In this embodiment, the shape of the magnetic tunnel junction (MTJ) device 30 is circular from a top view.

In this embodiment, the SOT MRAM 10 is arranged with a vertical magnetic tunnel junction (MTJ) device.

Figure 10:
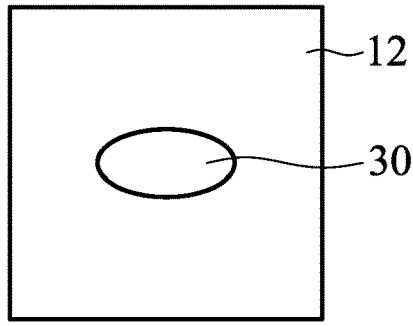
FIG. 10 is a top view of a spin-orbit torque (SOT) MRAM in accordance with one embodiment of the disclosure.

Referring to FIG. 10, in accordance with one embodiment of the disclosure, a spin-orbit torque magnetoresistive random access memory (SOT MRAM) 10 is provided. FIG. 10 is a top view of the SOT MRAM 10.

In this embodiment, the SOT MRAM 10 comprises a spin Hall metal layer 12 and a magnetic tunnel junction (MTJ) device 30.

The magnetic tunnel junction (MTJ) device 30 is disposed on the spin Hall metal layer 12.

In this embodiment, the magnetic tunnel junction (MTJ) device 30 comprises a free magnetic layer, a barrier layer and a pinned layer (not shown).

In this embodiment, the shape of the magnetic tunnel junction (MTJ) device 30 is elliptical from a top view.

In this embodiment, the SOT MRAM 10 is arranged with a horizontal magnetic tunnel junction (MTJ) device.

Referring to FIGS. 11A-11D, in accordance with one embodiment of the disclosure, a spin-orbit torque magnetoresistive random access memory (SOT MRAM) 10 is provided. FIGS. 11A-11D are top views of the SOT MRAM 10.

Figure 11A:
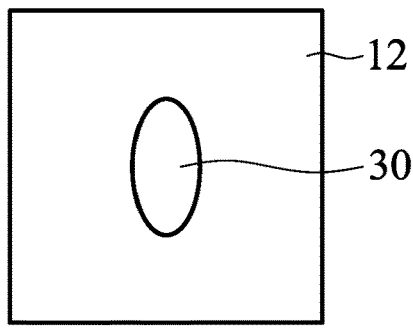
FIGS. 11A-11D are top views of a spin-orbit torque (SOT) MRAM in accordance with one embodiment of the disclosure.

As shown in FIG. 11A, in this embodiment, the SOT MRAM 10 comprises a spin Hall metal layer 12 and a magnetic tunnel junction (MTJ) device 30.

The magnetic tunnel junction (MTJ) device 30 is disposed on the spin Hall metal layer 12.

In this embodiment, the magnetic tunnel junction (MTJ) device 30 comprises a free magnetic layer, a barrier layer and a pinned layer (not shown).

In this embodiment, the shape of the magnetic tunnel junction (MTJ) device 30 is elliptical from a top view.

In this embodiment, the magnetic tunnel junction (MTJ) device 30 is disposed at a central position of the spin Hall metal layer 12.

Figure 11B:
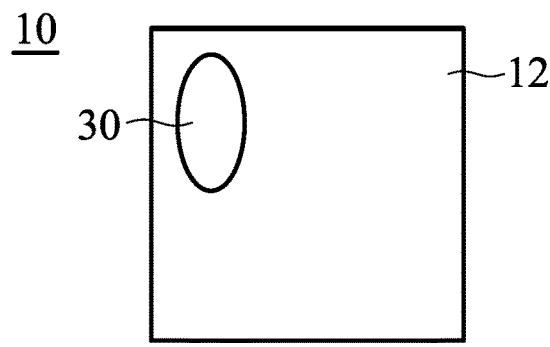

As shown in FIG. 11B, in this embodiment, the SOT MRAM 10 comprises a spin Hall metal layer 12 and a magnetic tunnel junction (MTJ) device 30.

The magnetic tunnel junction (MTJ) device 30 is disposed on the spin Hall metal layer 12.

In this embodiment, the magnetic tunnel junction (MTJ) device 30 comprises a free magnetic layer, a barrier layer and a pinned layer (not shown).

In this embodiment, the shape of the magnetic tunnel junction (MTJ) device 30 is elliptical from a top view.

In this embodiment, the magnetic tunnel junction (MTJ) device 30 is disposed at an upper-left position of the spin Hall metal layer 12.

Figure 11C:
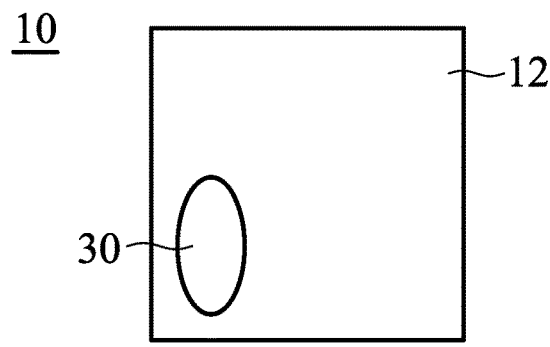

As shown in FIG. 11C, in this embodiment, the SOT MRAM 10 comprises a spin Hall metal layer 12 and a magnetic tunnel junction (MTJ) device 30.

The magnetic tunnel junction (MTJ) device 30 is disposed on the spin Hall metal layer 12.

In this embodiment, the magnetic tunnel junction (MTJ) device 30 comprises a free magnetic layer, a barrier layer and a pinned layer (not shown).

In this embodiment, the shape of the magnetic tunnel junction (MTJ) device 30 is elliptical from a top view.

In this embodiment, the magnetic tunnel junction (MTJ) device 30 is disposed at a lower-left position of the spin Hall metal layer 12.

Figure 11D:
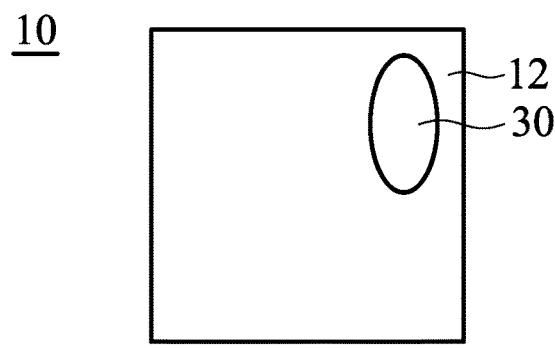

As shown in FIG. 11D, in this embodiment, the SOT MRAM 10 comprises a spin Hall metal layer 12 and a magnetic tunnel junction (MTJ) device 30.

The magnetic tunnel junction (MTJ) device 30 is disposed on the spin Hall metal layer 12.

In this embodiment, the magnetic tunnel junction (MTJ) device 30 comprises a free magnetic layer, a barrier layer and a pinned layer (not shown).

In this embodiment, the shape of the magnetic tunnel junction (MTJ) device 30 is elliptical from a top view.

In this embodiment, the magnetic tunnel junction (MTJ) device 30 is disposed on the right side of the spin Hall metal layer 12.

Referring to FIGS. 12A-12D, in accordance with one embodiment of the disclosure, a spin-orbit torque magnetoresistive random access memory (SOT MRAM) 10 is provided. FIGS. 12A-12D are top views of the SOT MRAM 10.

Figure 12A:
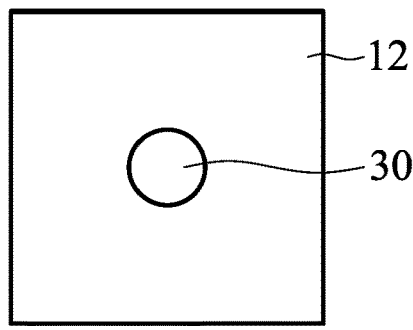
FIGS. 12A-12D are top views of a spin-orbit torque (SOT) MRAM in accordance with one embodiment of the disclosure.

As shown in FIG. 12A, in this embodiment, the SOT MRAM 10 comprises a spin Hall metal layer 12 and a magnetic tunnel junction (MTJ) device 30.

The magnetic tunnel junction (MTJ) device 30 is disposed on the spin Hall metal layer 12.

In this embodiment, the magnetic tunnel junction (MTJ) device 30 comprises a free magnetic layer, a barrier layer and a pinned layer (not shown).

In this embodiment, the shape of the magnetic tunnel junction (MTJ) device 30 is circular from a top view.

In this embodiment, the magnetic tunnel junction (MTJ) device 30 is disposed at a central position of the spin Hall metal layer 12.

Figure 12B:
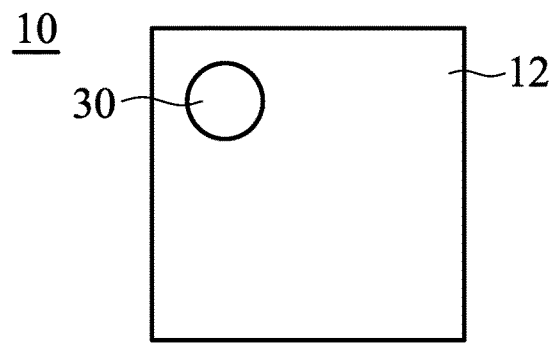

As shown in FIG. 12B, in this embodiment, the SOT MRAM 10 comprises a spin Hall metal layer 12 and a magnetic tunnel junction (MTJ) device 30.

The magnetic tunnel junction (MTJ) device 30 is disposed on the spin Hall metal layer 12.

In this embodiment, the magnetic tunnel junction (MTJ) device 30 comprises a free magnetic layer, a barrier layer and a pinned layer (not shown).

In this embodiment, the shape of the magnetic tunnel junction (MTJ) device 30 is circular from a top view.

In this embodiment, the magnetic tunnel junction (MTJ) device 30 is disposed at an upper-left position of the spin Hall metal layer 12.

Figure 12C:
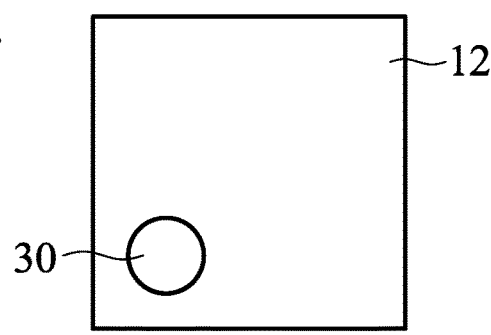

As shown in FIG. 12C, in this embodiment, the SOT MRAM 10 comprises a spin Hall metal layer 12 and a magnetic tunnel junction (MTJ) device 30.

The magnetic tunnel junction (MTJ) device 30 is disposed on the spin Hall metal layer 12.

In this embodiment, the magnetic tunnel junction (MTJ) device 30 comprises a free magnetic layer, a barrier layer and a pinned layer (not shown).

In this embodiment, the shape of the magnetic tunnel junction (MTJ) device 30 is circular from a top view.

In this embodiment, the magnetic tunnel junction (MTJ) device 30 is disposed at a lower-left position of the spin Hall metal layer 12.

Figure 12D:
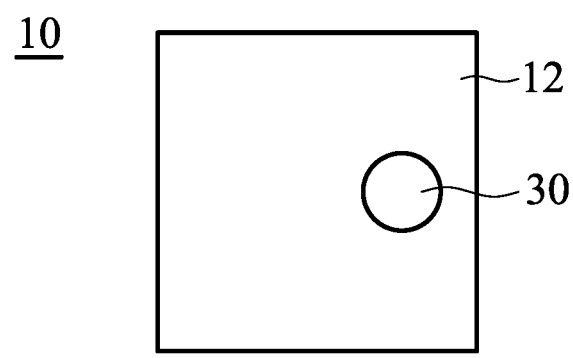

As shown in FIG. 12D, in this embodiment, the SOT MRAM 10 comprises a spin Hall metal layer 12 and a magnetic tunnel junction (MTJ) device 30.

The magnetic tunnel junction (MTJ) device 30 is disposed on the spin Hall metal layer 12.

In this embodiment, the magnetic tunnel junction (MTJ) device 30 comprises a free magnetic layer, a barrier layer and a pinned layer (not shown).

In this embodiment, the shape of the magnetic tunnel junction (MTJ) device 30 is circular from a top view.

In this embodiment, the magnetic tunnel junction (MTJ) device 30 is disposed on the right side of the spin Hall metal layer 12.

Example 1

The Electrical Test of the SOT MRAM (1)

The electrical test was performed on the spin-orbit torque (SOT) MRAM 10 as shown in FIG. 1.

Figure 13:
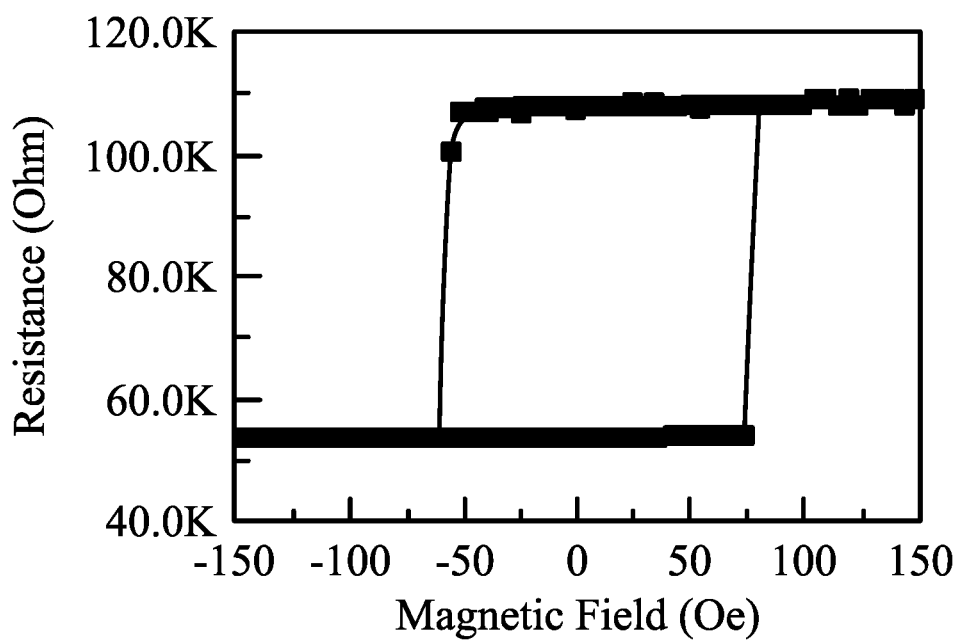
FIG. 13 is an electrical test chart of a spin-orbit torque (SOT) MRAM in accordance with one embodiment of the disclosure.

By applying a magnetic field, the magnetic tunnel junction (MTJ) device 30 of the SOT structure was read and written to obtain a complete R-H loop, as shown in FIG. 13. It represents that this process-optimized component can conduct normal read and write operations.

Example 2

The Electrical Test of the SOT MRAM (2)

The electrical test was performed on the spin-orbit torque (SOT) MRAM 10 as shown in FIG. 1.

Figure 14:
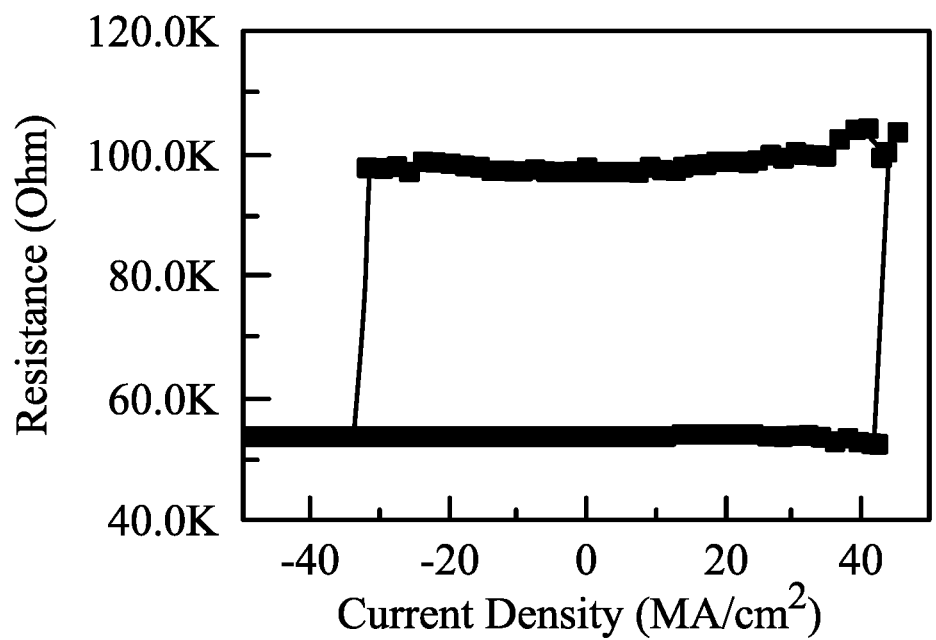
FIG. 14 is an electrical test chart of a spin-orbit torque (SOT) MRAM in accordance with one embodiment of the disclosure.

By applying current on the spin Hall metal layer 12 and the spin Hall effect to generate the spin Hall current, the magnetic tunnel junction (MTJ) device 30 was read and written to obtain a complete R-J loop, as shown in FIG. 14. It represents that this process-optimized component can conduct read and write operations by the SOT operation mechanism.

The present disclosure provides a top-pinned layer MTJ structure which is able to terminate an etching process at either any thickness position of a barrier layer or any thickness position of a bottom free magnetic layer, used as a component to develop the optimized process technology of the spin-orbit torque (SOT) MRAM. The uniformity of various layers can be achieved using etch selectivity ratios formed between various materials, for example, the etch selectivity ratio between the top pinned layer and the barrier oxide layer or between the barrier oxide layer and the free magnetic layer. In addition, a bottom ultra-thin heavy metal layer can be protected by the residual material of the barrier layer or the free magnetic layer. This component structure not only generates the splitting of the upper and lower spin currents by spin Hall effect, but also achieves the characteristics of the magnetic moment reversal of the free magnetic layer by the spin-orbit effect. Simultaneously, this component structure can overcome the problems that, due to an etching process, a bottom ultra-thin metal layer of a top-pinned layer MTJ of a conventional spin-orbit torque (SOT) structure is damaged which results in uneven operation characteristics and component failure. This process-optimized component structure can significantly improve the production yield of the spin-orbit torque (SOT) MRAM.

While the disclosure has been described by way of example and in terms of preferred embodiment, it is to be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A spin-orbit torque MRAM, comprising:
   a spin Hall metal layer having a top surface;
   a free magnetic layer disposed on the spin Hall metal layer;
   a barrier layer disposed on the free magnetic layer, wherein the barrier layer comprises a first area and a second area located on both sides of the first area, wherein the second area has a thickness that is smaller than that of the first area, and an orthogonal projection of the barrier layer onto the top surface of the spin Hall metal layer completely overlaps the top surface of the spin Hall metal layer; and
   a pinned layer disposed on the first area of the barrier layer.

2. The spin-orbit torque MRAM as claimed in claim 1, wherein the spin Hall metal layer has a thickness that is smaller than about 10 nm.

3. The spin-orbit torque MRAM as claimed in claim 1, wherein the thickness of the free magnetic layer is in a range from about 1 nm to about 3 nm.

4. The spin-orbit torque MRAM as claimed in claim 1, wherein the thickness of the first area of the barrier layer is in a range from about 0.5 nm to about 2 nm.

5. The spin-orbit torque MRAM as claimed in claim 1, wherein the thickness of the second area of the barrier layer is zero or greater than zero.

6. The spin-orbit torque MRAM as claimed in claim 1, wherein the free magnetic layer, the barrier layer and the pinned layer form a magnetic tunnel junction (MTJ) device.

7. The spin-orbit torque MRAM as claimed in claim 6, wherein the magnetic tunnel junction (MTJ) device has the shape of a circle, an ellipse, a square, or a rectangle, from a top view.

8. A spin-orbit torque MRAM, comprising:
   a spin Hall metal layer having a top surface;
   a free magnetic layer disposed on the spin Hall metal layer, wherein the free magnetic layer comprises a first area and a second area located on both sides of the first area, and the second area has a thickness that is equal to or smaller than that of the first area, and an orthogonal projection of the free magnetic layer onto the top surface of the spin Hall metal layer completely overlaps the top surface of the spin Hall metal layer;

a barrier layer disposed on the first area of the free magnetic layer, wherein an orthogonal projection of the barrier layer onto the top surface of the spin Hall metal layer is smaller than the top surface of the spin Hall metal layer; and a pinned layer disposed on the barrier layer.

9. The spin-orbit torque MRAM as claimed in claim 8, wherein the spin Hall metal layer has a thickness that is smaller than about 10 nm.

10. The spin-orbit torque MRAM as claimed in claim 8, wherein the thickness of the first area of the free magnetic layer is in a range from about 1 nm to about 3 nm.

11. The spin-orbit torque MRAM as claimed in claim 8, wherein the thickness of the barrier layer is in a range from about 0.5 nm to about 2 nm.

12. The spin-orbit torque MRAM as claimed in claim 8, wherein the thickness of the second area of the free magnetic layer is greater than zero.

13. The spin-orbit torque MRAM as claimed in claim 8, wherein the free magnetic layer, the barrier layer and the pinned layer form a magnetic tunnel junction (MTJ) device.

14. The spin-orbit torque MRAM as claimed in claim 13, wherein the magnetic tunnel junction (MTJ) device has the shape of a circle, an ellipse, a square, or a rectangle, from a top view.

15. A method for fabricating a spin-orbit torque MRAM, comprising:

providing a spin Hall metal layer;

disposing a free magnetic layer on the spin Hall metal layer, wherein the free magnetic layer comprises a first area and a second area located on both sides of the first area;

disposing a barrier layer on the free magnetic layer, wherein the barrier layer comprises a first area and a second area located on both sides of the first area, the first area of the barrier layer is disposed on the first area of the free magnetic layer, and the second area of the barrier layer is disposed on the second area of the free magnetic layer, wherein the second area of the barrier layer is continuously etched using the patterned photoresist layer as a mask such that the thickness of the second area is smaller than that of the first area of the barrier layer;

disposing a pinned layer on the barrier layer;

disposing a patterned photoresist layer on the pinned layer; and etching the pinned layer using the patterned photoresist layer as a mask to expose the second area of the barrier layer.

16. The method for fabricating a spin-orbit torque MRAM as claimed in claim 15, wherein the pinned layer is etched by a plasma etching (PE) process, a reactive ion etching (RIE) process, an ion beam etching (IBE) process, or an inductively coupled plasma etching (ICPE) process.

17. The method for fabricating a spin-orbit torque MRAM as claimed in claim 15, wherein the pinned layer is etched by a reactive ion etching (RIE) process.

18. The method for fabricating a spin-orbit torque MRAM as claimed in claim 17, wherein the reactive ion etching (RIE) process has an etching gas comprising carbon monoxide and ammonia, or oxygen, or hydrogen, or fluorine and argon.

19. The method for fabricating a spin-orbit torque MRAM as claimed in claim 18, wherein the second area of the barrier layer is continuously etched using the patterned photoresist layer as a mask until the second area of the free magnetic layer is exposed.

20. The method for fabricating a spin-orbit torque MRAM as claimed in claim 19, wherein the pinned layer and the barrier layer have an etch selectivity ratio therebetween of about 3:1 or above.

21. The method for fabricating a spin-orbit torque MRAM as claimed in claim 19, wherein the second area of the free magnetic layer is continuously etched using the patterned photoresist layer as a mask such that the thickness of the second area is smaller than that of the first area of the free magnetic layer.

22. The method for fabricating a spin-orbit torque MRAM as claimed in claim 21, wherein the barrier layer and the free magnetic layer have an etch selectivity ratio therebetween of about 1:3 or above.

* * * * *